United States Patent
Kameyama et al.

(10) Patent No.: US 7,256,497 B2
(45) Date of Patent: Aug. 14, 2007

(54) SEMICONDUCTOR DEVICE WITH A BARRIER LAYER AND A METAL LAYER

(75) Inventors: Koujiro Kameyama, Ota (JP); Akira Suzuki, Ota (JP); Yoshio Okayama, Brookline, MA (US)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/054,603

(22) Filed: Feb. 10, 2005

(65) Prior Publication Data

US 2005/0269704 A1    Dec. 8, 2005

(30) Foreign Application Priority Data

Feb. 17, 2004    (JP) ............... 2004-040409

(51) Int. Cl.
*H01L 29/74*    (2006.01)
*H01L 21/4763*    (2006.01)

(52) U.S. Cl. ............... 257/751; 257/E23.011; 257/E21.597; 257/700; 257/701; 257/758; 257/774; 257/773

(58) Field of Classification Search ........ 257/E23.011, 257/E21.597, 778, 737, 751, 700, 701, 773, 257/758–760, 774, 784, 786, 763, 765–767, 257/379, 310, 309, 306

See application file for complete search history.

(56) References Cited

U.S. PATENT DOCUMENTS

| 6,005,291 | A * | 12/1999 | Koyanagi et al. ............ 257/751 |
| 6,107,182 | A * | 8/2000 | Asahina et al. .............. 438/618 |
| 6,261,953 | B1 * | 7/2001 | Uozumi ....................... 438/687 |
| 6,287,977 | B1 * | 9/2001 | Hashim et al. .............. 438/722 |
| 6,646,289 | B1 | 11/2003 | Badehi |
| 6,747,355 | B2 * | 6/2004 | Abiru et al. ................. 257/758 |
| 6,872,656 | B2 * | 3/2005 | Sakai .......................... 438/637 |
| 6,888,220 | B2 * | 5/2005 | Akiyama .................... 257/532 |
| 6,903,398 | B2 * | 6/2005 | Yamamoto .................. 257/295 |
| 2002/0030267 | A1 | 3/2002 | Suzuki |
| 2002/0037624 | A1 * | 3/2002 | Mori et al. .................. 438/396 |
| 2002/0055265 | A1 | 5/2002 | Ring |
| 2002/0123228 | A1 | 9/2002 | Smoak et al. |

(Continued)

FOREIGN PATENT DOCUMENTS

| EP | 0663693 A | 7/1995 |
| EP | 1376678 A | 1/2004 |
| EP | 1408547 A | 4/2004 |
| JP | 2002-083936 A | 3/2002 |
| JP | 2002-512436 T | 4/2002 |
| JP | 2005-019522 A | 1/2005 |
| WO | 99/40624 | 8/1999 |

*Primary Examiner*—Alexander Oscar Williams
(74) *Attorney, Agent, or Firm*—Morrison & Foerster LLP

(57) ABSTRACT

This invention provides a semiconductor device that can minimize deterioration of electric characteristics of the semiconductor device while minimizing the amount of etching required. In the semiconductor device of the invention, a pad electrode layer formed of a first barrier layer and an aluminum layer laminated thereon is formed on a top surface of a semiconductor substrate. A supporting substrate is further attached on the top surface of the semiconductor substrate. A second barrier layer is formed on a back surface of the semiconductor substrate and in a via hole formed from the back surface of the semiconductor substrate to the first barrier layer. Furthermore, a wiring layer is formed in the via hole so as to completely fill the via hole or so as not to completely fill the via hole. A ball-shaped terminal is formed on the wiring layer.

18 Claims, 3 Drawing Sheets

U.S. PATENT DOCUMENTS

| | | |
|---|---|---|
| 2004/0137701 A1 | 7/2004 | Takao |
| 2005/0003649 A1 | 1/2005 | Takao |
| 2005/0006769 A1* | 1/2005 | Givens et al. .............. 257/751 |
| 2005/0127426 A1* | 6/2005 | Nishikawa .................. 257/309 |
| 2005/0189637 A1* | 9/2005 | Okayama et al. ........... 257/679 |
| 2005/0196957 A1* | 9/2005 | Kameyama et al. ........ 438/637 |
| 2005/0233582 A1* | 10/2005 | Friedemann et al. ........ 438/672 |
| 2005/0242435 A1* | 11/2005 | Werking et al. ............ 257/737 |
| 2005/0269696 A1* | 12/2005 | Ochiai ........................ 257/734 |
| 2006/0024966 A1* | 2/2006 | Umemoto et al. .......... 438/689 |
| 2006/0033168 A1* | 2/2006 | Umemoto et al. .......... 257/379 |

* cited by examiner

SEMICONDUCTOR DEVICE WITH A BARRIER LAYER AND A METAL LAYER

CROSS-REFERENCE OF THE INVENTION

This invention is based on Japanese Patent Application No. 2004-40409, the content of which is incorporated by reference in its entirety.

BACKGROUND OF THE INVENTION

1. Field of the Invention

This invention relates to a semiconductor device and a manufacturing method thereof, particularly, to a semiconductor device having a semiconductor substrate formed with a via hole and a manufacturing method thereof.

2. Description of the Related Art

Conventionally, a BGA (ball grip array) type semiconductor devices have been known as a kind of a chip size package having almost same outside dimensions as those of a semiconductor die. In this BGA type semiconductor device, a plurality of ball-shaped terminals made of a metal such as solder is arrayed in a grid pattern on one surface of the package, and electrically connected with the semiconductor die mounted on the other side of the package.

When this BGA type semiconductor device is mounted on electronic equipment, the semiconductor die is electrically connected with an external circuit on a printed circuit board by compression bonding of the ball-shaped terminals to wiring patterns on the printed circuit board.

Such a BGA type semiconductor device has advantages in providing a large number of ball-shaped terminals and in reducing size over other CSP type semiconductor devices such as SOP (Small Outline Package) and QFP (Quad Flat Package), which have lead pins protruding from their sides. The BGA type semiconductor device is used as an image sensor chip for a digital camera incorporated into a mobile telephone, for example. In this case, a supporting substrate made of, for example, glass is attached to a surface or both surfaces of the semiconductor die. The relating technology is disclosed in the Japanese Patent Application Publication No. 2002-512436.

Next, descriptions will be made on the BGA type semiconductor device and the manufacturing method thereof of the conventional art in a case where a sheet of supporting substrate is attached to the semiconductor die, with reference to drawings.

FIGS. 5 to 7 are cross-sectional views of the BGA type semiconductor device and the manufacturing method thereof of the conventional art, which are applicable to the image sensor chip. First, as shown in FIG. 5, a pad electrode layer 34 made of an aluminum layer or an aluminum alloy layer is formed on a top surface of a semiconductor substrate 30 with an insulation film, for example, an oxide film 31 interposed therebetween. Then, a supporting substrate 36 made of, for example, a glass is further attached on the top surface of the semiconductor substrate 30 including the pad electrode layer 34 with a resin layer 35 interposed therebetween.

Next, as shown in FIG. 6, a resist layer 37 is formed on a back surface of the semiconductor substrate 30, having an opening in a position corresponding to the pad electrode layer 34. Then, dry etching is performed to the semiconductor substrate 30 by using this resist layer 37 as a mask to form a via hole 38 from the back surface of the semiconductor substrate 30 to the pad electrode layer 34. On a part of the pad electrode layer 34 at a bottom of the via hole 38 formed by the etching, an aluminum oxide 50 (e.g. $Al_2O_3$ compound) is formed during etching.

Then, as shown in FIG. 7, a barrier layer 39 is formed on the back surface of the semiconductor substrate 30 including inside the via hole 38. A seed layer for plating 40 is formed on the barrier layer 39, and plating is performed to this seed layer 40 to form a re-distribution layer 41 made of, for example, copper (Cu). Furthermore, a protection layer (not shown) is formed on the re-distribution layer 41, and an opening is formed in a predetermined position of the protection layer to form a ball-shaped terminal 42 being in contact with the re-distribution layer 41.

Then, although not shown, the semiconductor substrate and the layers laminated thereon are cut off and separated into individual semiconductor dice. In this way, the BGA type semiconductor device where the pad electrode layer 34 and the ball-shaped terminal 42 are electrically connected with each other is formed.

However, when the via hole 38 is formed by the etching, the aluminum oxide 50 formed on the bottom thereof is positioned on a part of the pad electrode layer 34, thereby forming high resistance between the pad electrode layer 34 and the re-distribution layer 41. Furthermore, the aluminum oxide 50 degrades covering characteristics of the pad electrode layer 34 for the re-distribution layer 41, thereby easily causing damages such as disconnection of the re-distribution layer 41. This causes a problem of deteriorating the characteristics of the semiconductor device.

Although this problem seems to be solved by removing this aluminum oxide 50 by further etching, the etching process adds to the complexity of the manufacturing process.

SUMMARY OF THE INVENTION

The invention provides a semiconductor device that includes a semiconductor die having a via hole extending from a back surface of the semiconductor die to a top surface of the semiconductor die and a pad electrode layer covering the via hole at the top surface of the semiconductor die and having a first barrier layer and a metal layer made of aluminum or an aluminum alloy. The first barrier layer is disposed closer to the top surface of the semiconductor die than the metal layer. The device also includes a supporting member attached to the top surface of the semiconductor die and a redistribution layer disposed on the back surface of the semiconductor die and extending into the via hole to be in contact with the first barrier layer.

The invention also provides a method of manufacturing a semiconductor device. The method includes providing a semiconductor substrate having a pad electrode layer that includes a first barrier layer formed on a top surface of the semiconductor substrate and a metal layer made of aluminum or an aluminum alloy formed on the first barrier layer, attaching a supporting member to the top surface of the semiconductor substrate, forming a via hole in the semiconductor substrate from a back surface of the semiconductor substrate to expose the first barrier layer, and forming a redistribution layer on the back surface of the semiconductor substrate so that the redistribution layer extends into the via hole to connect with the first barrier layer.

DETAILED DESCRIPTION OF THE INVENTION

Figure 4:
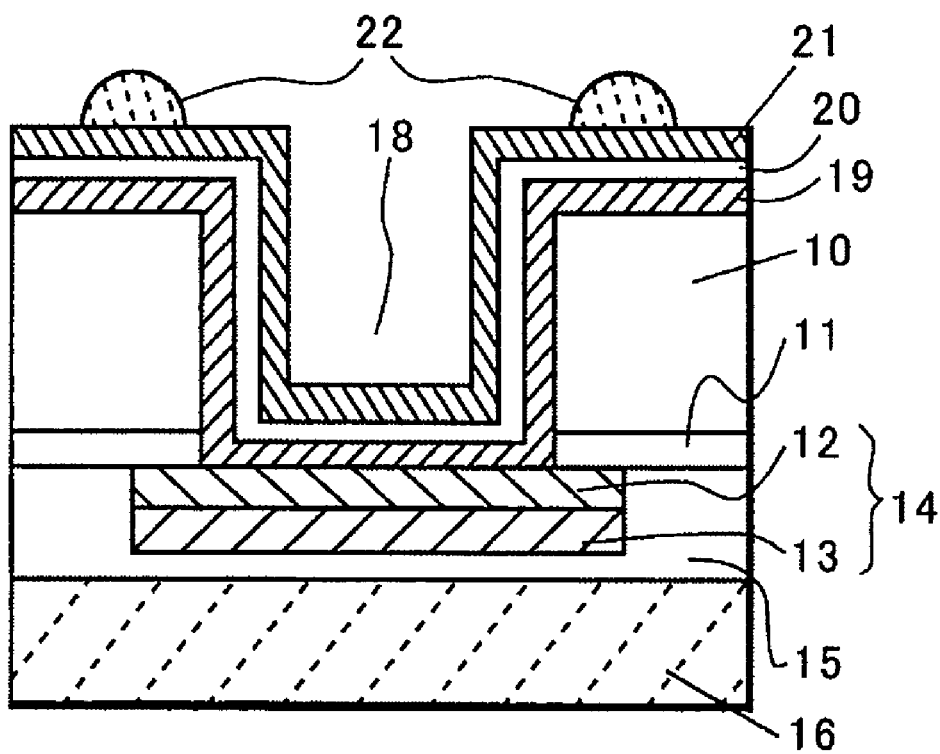
FIG. 4 is a cross-sectional view of a device intermediate at a process step following the step of FIG. 3.
Figure 5:
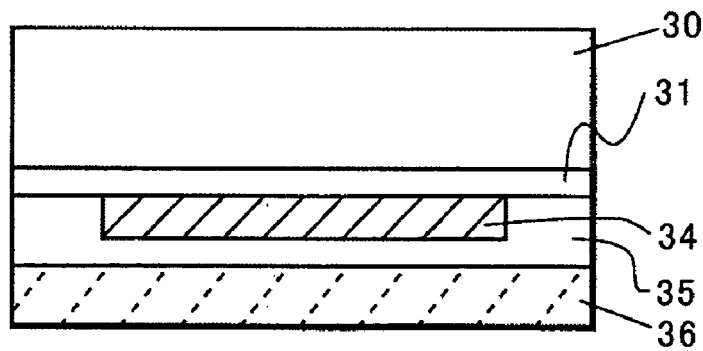
FIGS. 5-7 show process steps of a method of manufacturing a semiconductor device according to conventional art.

Next, a structure of a semiconductor device of an embodiment will be described with reference to the drawings. FIG. 4 shows a cross-sectional view of the semiconductor device of this embodiment in a region formed with a pad electrode layer described later before separated into individual semiconductor dice.

As shown in FIG. 4, a pad electrode layer 14 having a first barrier layer 12 and an aluminum layer (or an aluminum alloy layer) 13 laminated thereon is formed on the top surface of the semiconductor substrate 10, which will be separated into individual semiconductor dice at a later process step, made of Si with an insulating film, for example, an oxide film 11 interposed therebetween. That is, the first barrier layer 12 is placed closer to the semiconductor substrate 10.

The semiconductor substrate 10 is formed with a circuit (not shown), and the pad electrode layer 14 is electrically connected with this circuit. This circuit (not shown) is, for example, a CCD (charge coupled device) image sensor. Such a circuit needs an optical black region as a reference point of the CCD image, so that it is preferable that the aluminum layer 13 forming the pad electrode layer 14 is made of pure aluminum which can shield light (infrared ray), or made of an Al—Cu layer. Alternatively, it is preferable that the aluminum layer 13 is made of a metal other than alloy containing silicon (Si) which transmits infrared ray, e.g., Al—Si and Al—Si—Cu.

Furthermore, it is preferable that the first barrier layer 12 is a titanium nitride (TiN) layer, for example. Alternatively, the first barrier layer 12 can be made of a metal layer other than the titanium nitride layer as long the metal layer is a layer of a refractory metal or a metal-compound layer having a high melting point, and can also be made of a tantalum (Ta) layer, a titanium tungsten (TiW) layer, a tantalum nitride (TaN) layer, and so on.

Furthermore, a supporting substrate 16 formed of a glass which can transmit light of a predetermined wavelength band is formed on the top surface of the semiconductor substrate 10 with a resin layer 15 (functioning as an adhesive) interposed therebeween. This glass substrate 16 may be replaced with a protecting tape and attached to the silicon substrate 10. In addition, a double-sided adhesive tape may be also used to as a support. In this semiconductor substrate 10, a via hole 18 is formed in a region where the pad electrode layer 14 is formed, from a back surface of the semiconductor substrate 10 to a first barrier layer 12 of the pad electrode layer 14. The pad electrode layer 14 is covered with a passivation film (not shown) made of silicon nitride or the like. Furthermore, on the back surface of the semiconductor substrate 10 including inside this via hole 18, a second barrier layer 19 is formed to cover an insulation layer formed for insulating a sidewall of the semiconductor substrate 10 exposed through the via hole 18. It is preferable that this second barrier layer 19 is made of a titanium nitride layer, for example. Alternatively, the second barrier layer 19 can be made of a metal layer other than a titanium nitride layer, such as the first barrier layer.

A seed layer for plating 20 and a re-distribution layer 21 deposited by plating are formed on the second barrier layer 19. Furthermore, a protection layer (not shown) is formed on the re-distribution layer 21, and an opening is formed in a predetermined position of the protection layer to form a ball-shaped terminal 22 being in contact with the re-distribution layer 21. That is, this ball-shaped terminal 22 is electrically connected with the pad electrode layer 14 through the re-distribution layer 21, the seed layer 20, and the second barrier layer 19.

Next, a manufacturing method of the semiconductor device of the embodiment described above will be described with reference to FIGS. 1 to 4, which are cross-sectional views showing the manufacturing method of the semiconductor device of this embodiment. FIGS. 1 to 4 correspond to a region in which the pad electrode layer 14 is formed prior to the separation into individual semiconductor dice.

Figure 1:
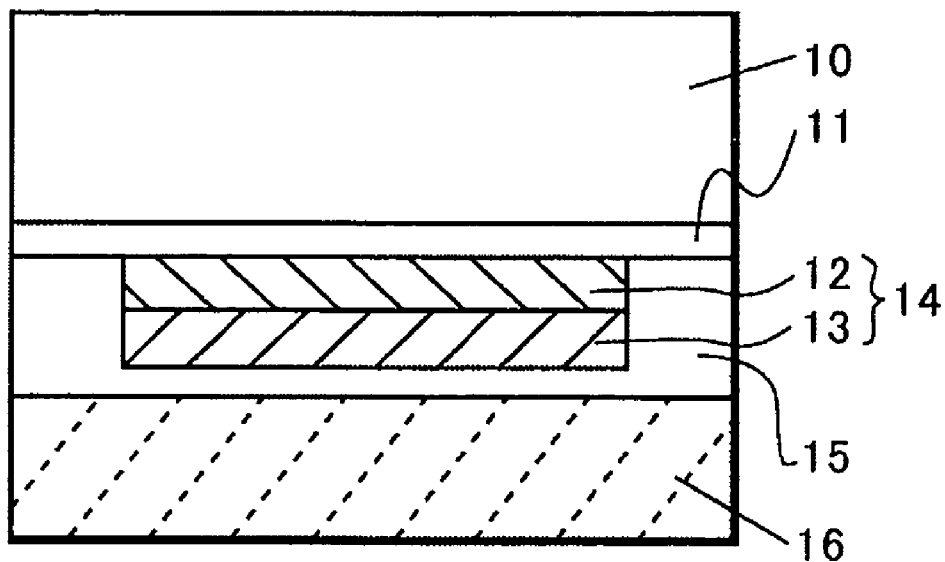
FIG. 1 is a cross-sectional view of a device intermediate of a semiconductor device of an embodiment of the invention at a process step of its manufacturing method.

First, as shown in FIG. 1, the pad electrode layer 14 formed of the first barrier layer 12 and the aluminum layer 13 or an aluminum alloy layer laminated thereon is formed on the top surface of the semiconductor substrate 10 formed with a circuit (not shown) with the insulation film, for example, the oxide film 11 interposed therebetween. That is, the first barrier layer 12 is formed in a position closer to the semiconductor die 10.

In a case where the circuit (not shown) is a CCD image sensor, for example, it is preferable that the aluminum layer 13 forming the pad electrode layer 14 is made of pure aluminum. Furthermore, it is preferable that the aluminum layer 13 is formed having a thickness so as to shield light (infrared ray), e.g., 2 μm. Furthermore, it is preferable that the first barrier layer 12 is a titanium nitride (TiN) layer, for example. In this embodiment, the titanium nitride (TiN) layer is formed by sputtering by using a sputtering apparatus set at 250° C. Alternatively, the first barrier layer 12 can be made of metal other than titanium nitride, as long as the metal is a refractory metal or a compound of the metal having the high melting point.

Furthermore, a supporting substrate 16 formed of the glass is formed on the top surface of the semiconductor substrate 10 with the resin layer 15 (functioning as an adhesive) interposed therebeween.

Figure 2:
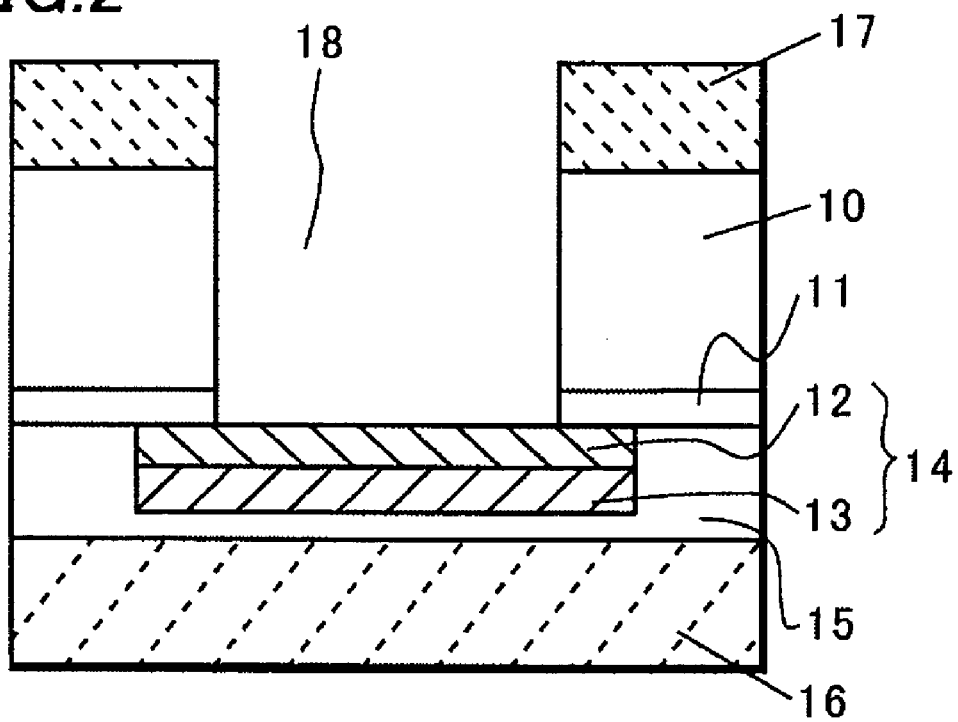
FIG. 2 is a cross-sectional view of a device intermediate at a process step following the step of FIG. 1.

Next, as shown in FIG. 2, a resist layer 17 having an opening in a position corresponding to a part of the pad electrode layer 14 is formed on the back surface of the semiconductor substrate 10. Etching is performed to the semiconductor substrate 10 by using the resist layer 17 as a mask to form the via hole 18 from the back surface of the semiconductor substrate 10 to the first barrier layer 12 of the pad electrode layer 14. When the semiconductor substrate 10 is formed of silicon (Si), it is preferable that the etching is performed by dry-etching by using etching gas including $SF_6$, $O_2$, or fluorocarbon such as $C_2F_4$, $C_4F_8$, $CHF_3$ or a combination thereof.

Figure 6:
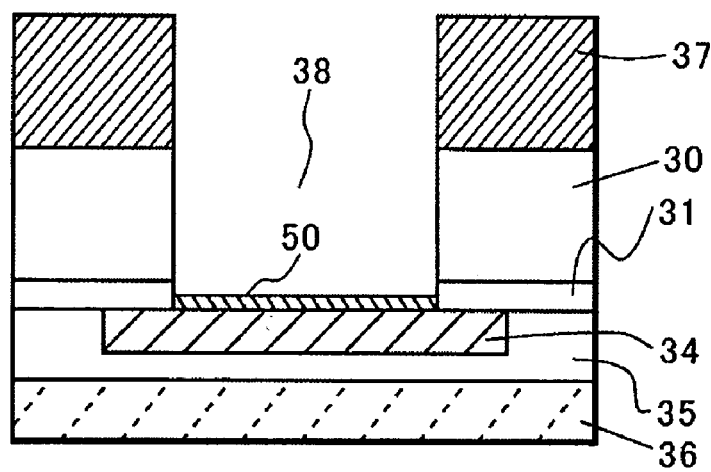
Figure 7:
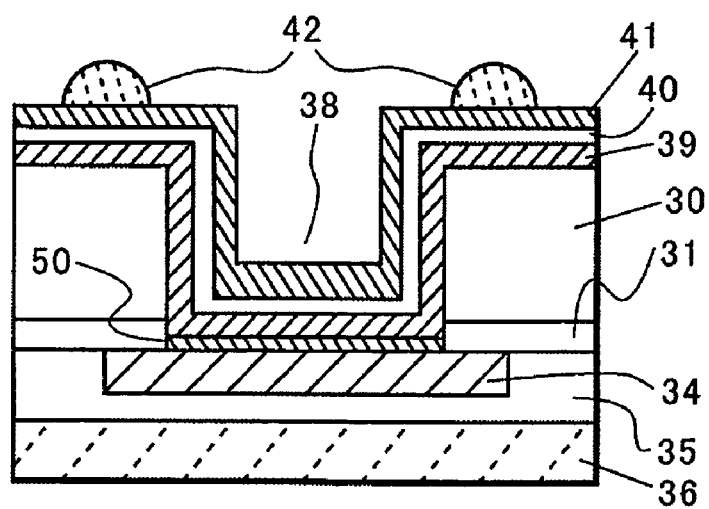

The surface of the pad electrode layer 14 at a bottom of the via hole 18 is the first barrier layer 12, so that the etching does not reach the aluminum layer 13. Therefore, an oxide such as an aluminum oxide (e.g. an $Al_2O_3$ compound) 50 as seen in FIG. 6 showing a semiconductor device of a conventional art is not formed there.

Figure 3:
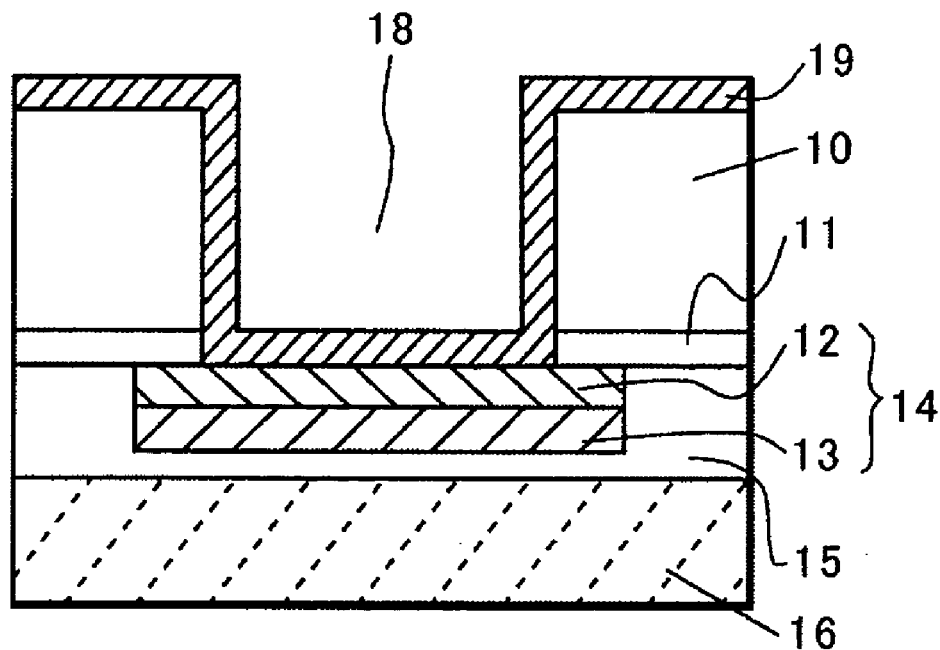
FIG. 3 is a cross-sectional view of a device intermediate at a process step following the step of FIG. 2.

Next, after the resist layer 17 is removed, an insulation layer made of an oxide film is formed on the back surface of the semiconductor substrate 10 including inside the via hole 18 so as to cover these as shown in FIG. 3. Then, after the insulation layer on the first barrier layer 12 is removed, the second barrier layer 19 is formed on the whole surface. Preferably, this second barrier layer 19 is made of a titanium nitride layer, for example, and the titanium nitride layer is formed by a CVD (Chemical Vapor Deposition) method in a CVD apparatus at 200° C. or less in this embodiment. Alternatively, as described above, the second barrier layer 19 can be made of a metal other than titanium nitride as long as the metal is a refractory metal or is a compound of the metal having the high melting point. It is noted that a cushioning member (not shown) for cushioning stress applied to the ball-shaped terminal 22 can be formed on the semiconductor substrate 10 or the second barrier layer 19 before or after the second barrier layer 19 is formed. The aluminum layer 13 is not exposed when the insulation layer (e.g. an oxide film) on the first barrier layer 12 is removed by etching because of the first barrier layer 12, the aluminum oxide is not formed.

Next, as shown in FIG. 4, the re-distribution layer 21 is formed on the whole surface of the second barrier layer 19. At this time, first, the seed layer for plating 20 made of, for example, copper (Cu) is formed on the whole surface of the second barrier layer 19 by electrolytic plating, and then electroless plating is performed to the seed layer 20, thereby forming the re-distribution layer 21 made of, for example, copper (Cu). The re-distribution layer 21 can be formed so as to completely fill the via hole 18 or so as not to completely fill the via hole 18.

Furthermore, the protection layer (not shown) is formed on the re-distribution layer 21. An opening is provided in a predetermined position of the protection layer, and then solder is printed on the opening by screen printing and then reflowed, so that the ball-shaped terminal 22 is formed on the opening. Then, although not shown, the semiconductor substrate 10 and the layers laminated thereon are cut off along a dicing line, thereby completing individual semiconductor dice, that is, the semiconductor device of this embodiment.

As described above, in the semiconductor device and the manufacturing method thereof of this invention, the pad electrode layer 14 formed of the first barrier layer 12 (e.g. made of the titanium nitride layer) and the aluminum layer 13 or the aluminum alloy layer laminated thereon is formed on the top surface of the semiconductor substrate 10.

Accordingly, when the via hole 18 is formed by etching, the first barrier layer 12 prevents the aluminum oxide from being formed on the pad electrode layer 14 at the bottom of the via hole 18. Therefore, forming high resistance between the pad electrode layer 14 and the re-distribution layer 21 can be minimized. Furthermore, damages such as disconnection of the re-distribution layer 21 can be minimized. As a result, deterioration of characteristics of the semiconductor device caused by formation of the via hole 18 can be minimized. Furthermore, the aluminum oxide 50 need not be removed, so that the etching process need not be increased.

In this embodiment, the second barrier layer 19 is formed on the back surface of the semiconductor substrate 10 including the via hole 18. However, the re-distribution layer 21 can be formed on the back surface of the semiconductor substrate 10 including the via hole 18 with the insulation layer interposed therebetween without forming the second barrier layer 19.

In this embodiment, the re-distribution layer 21 is formed by plating. However, the re-distribution layer 21 can be formed without forming the seed layer for plating 20 by a method other than the plating method, for example, by sputtering metal such as aluminum (Al).

This embodiment is applied to the semiconductor device formed with the ball-shaped terminal 22. However, the invention is applicable to a semiconductor device having no ball-shaped terminal as long as the via hole penetrating the semiconductor substrate is formed therein, for example, a semiconductor device of an LGA (land grid array).

Furthermore, in this embodiment, since the first barrier layer 12 is formed on the aluminum layer 13 on the side to be formed with the via hole 18, the surface of the aluminum layer 13 can be prevented from being etched by over-etching when etching is performed for forming the via hole. Therefore, it is not necessary to increase a film thickness of the aluminum layer 13 in consideration of an etching amount by over-etching.

What is claimed is:

1. A semiconductor device comprising:
   a semiconductor die having a via hole extending from a back surface of the semiconductor die to a top surface of the semiconductor die;
   a pad electrode layer covering the via hole at the top surface of the semiconductor die and comprising a first barrier layer and a metal layer, the first barrier layer being disposed closer to the top surface of the semiconductor die than the metal layer;
   a supporting member attached to the top surface of the semiconductor die;
   a wiring layer disposed on the back surface of the semiconductor die and extending into the via hole to be in contact with the first barrier layer.

2. The semiconductor device of claim 1, wherein the wiring layer substantially fills up the via hole.

3. The semiconductor device of claim 1, wherein the wiring layer fills the via hole only partially.

4. The semiconductor device of claim 1, wherein the wiring layer comprises a layer formed by plating or by sputtering.

5. The semiconductor device of claim 1, further comprising a conductive terminal formed on the wiring layer.

6. The semiconductor device of claim 1, wherein the first barrier layer is made of titanium nitride, titanium tungsten, tantalum nitride, a refractory metal, a metal compound having a high melting point or a combination thereof.

7. The semiconductor device of claim 1, further comprising a second barrier layer covering the wiring layer.

8. The semiconductor device of claim 7, wherein the second barrier layer is made of titanium nitride, titanium tungsten, tantalum nitride, a refractory metal, a metal compound having a high melting point or a combination thereof.

9. The semiconductor device of claim 1, wherein the metal layer of the pad electrode layer is made of aluminum or an aluminum alloy.

10. A semiconductor device comprising:
    a semiconductor die having a via hole extending from a back surface of the semiconductor die to a top surface of the semiconductor die;
    a pad electrode layer covering the via hole at the top surface of the semiconductor die and comprising a first barrier layer and a metal layer, the first barrier layer being disposed closer to the top surface of the semiconductor die than the metal layer;
    a wiring layer disposed on the back surface of the semiconductor die and extending into the via hole to be in contact with the first barrier layer.

11. The semiconductor device of claim 10, wherein the wiring layer substantially fills up the via hole.

12. The semiconductor device of claim 10, wherein the wiring layer fills the via hole only partially.

13. The semiconductor device of claim 10, wherein the wiring layer comprises a layer formed by plating or by sputtering.

14. The semiconductor device of claim 10, further comprising a conductive terminal formed on the wiring layer.

15. The semiconductor device of claim 10, wherein the first barrier layer is made of titanium nitride, titanium tungsten, tantalum nitride, a refractory metal, a metal compound having a high melting point or a combination thereof.

16. The semiconductor device of claim 10, further comprising a second barrier layer covering the wiring layer.

17. The semiconductor device of claim 16, wherein the second barrier layer is made of titanium nitride, titanium tungsten, tantalum nitride, a refractory metal, a metal compound having a high melting point or a combination thereof.

18. The semiconductor device of claim 10, wherein the metal layer of the pad electrode layer is made of aluminum or an aluminum alloy.

* * * * *